(12) United States Patent
Alami et al.

(10) Patent No.: US 10,083,822 B2
(45) Date of Patent: Sep. 25, 2018

(54) PHYSICAL VAPOUR DEPOSITION COATING DEVICE AS WELL AS A PHYSICAL VAPOUR DEPOSITION METHOD

(75) Inventors: Jones Alami, Bergisch-Gladbach (DE); Georg Erkens, Aachen (DE); Tariq Rasa, Aachen (DE); Jörg Vetter, Bergisch Gladbach (DE)

(73) Assignee: OERLIKON SURFACE SOLUTIONS AG, PFAEFFIKON, Pfäffikon SZ (CH)

( * ) Notice: Subject to any disclaimer, the term of this patent is extended or adjusted under 35 U.S.C. 154(b) by 506 days.

(21) Appl. No.: 12/543,721

(22) Filed: Aug. 19, 2009

(65) Prior Publication Data
US 2010/0044214 A1     Feb. 25, 2010

(30) Foreign Application Priority Data
Aug. 25, 2008 (EP) .................... 08162884

(51) Int. Cl.
*C23C 14/00* (2006.01)
*H01J 37/34* (2006.01)
*H01J 37/32* (2006.01)

(52) U.S. Cl.
CPC ........ *H01J 37/34* (2013.01); *H01J 37/32055* (2013.01); *H01J 37/3438* (2013.01); *H01J 37/3467* (2013.01)

(58) Field of Classification Search
CPC ... H01J 37/32055; H01J 37/3438; H01J 37/34
USPC .................................................. 204/298.11
See application file for complete search history.

(56) References Cited

U.S. PATENT DOCUMENTS

| 3,927,225 | A | * | 12/1975 | Cordes et al. ................ 438/581 |
| 4,225,409 | A | * | 9/1980 | Minomura ............... 204/192.25 |
| 5,294,322 | A | * | 3/1994 | Vetter et al. ............. 204/298.41 |
| 2001/0009225 | A1 | | 7/2001 | Leyendecker et al. |

(Continued)

FOREIGN PATENT DOCUMENTS

| EP | 0 677 595 | 4/1998 |
| EP | 0 558 061 | 8/2000 |

(Continued)

OTHER PUBLICATIONS

Machine translation of JP 2002249867 A.*
European Search Report for Patent Application 08162884.4, dated Feb. 20, 2009.

*Primary Examiner* — Timon Wanga
(74) *Attorney, Agent, or Firm* — Greenblum & Bernstein, P.L.C.

(57) ABSTRACT

The invention relates to a physical vapor deposition coating device (1), comprising a process chamber (2) with an anode (3) and a consumable cathode (4) to be consumed by an electrical discharge for coating a substrate located within the process chamber (2). The coating device (1) further includes a first electrical energy source (5) being connected with its negative pole to said consumable cathode (4), and a second electrical energy source (6) being connected with its positive pole to said anode (3). According to the invention, a third electrical energy source (7) is provided being connected with its negative pole to a source cathode (8) which is different from the consumable cathode (4). In addition, the invention relates to a physical vapor deposition method for coating a substrate.

25 Claims, 1 Drawing Sheet

(56) References Cited

U.S. PATENT DOCUMENTS

2002/0029960 A1    3/2002  Morimoto et al.
2003/0230483 A1*  12/2003  Sunthankar et al. .... 204/298.41
2007/0034491 A1    2/2007  Christyakov

FOREIGN PATENT DOCUMENTS

| EP | 1187172 A | | 3/2002 | |
|----|-----------|---|--------|---|
| JP | 2002249867 A | * | 9/2002 | ............. C23C 14/22 |
| WO | WO 91/00374 | | 1/1991 | |
| WO | 2007124879 A | | 11/2007 | |

* cited by examiner

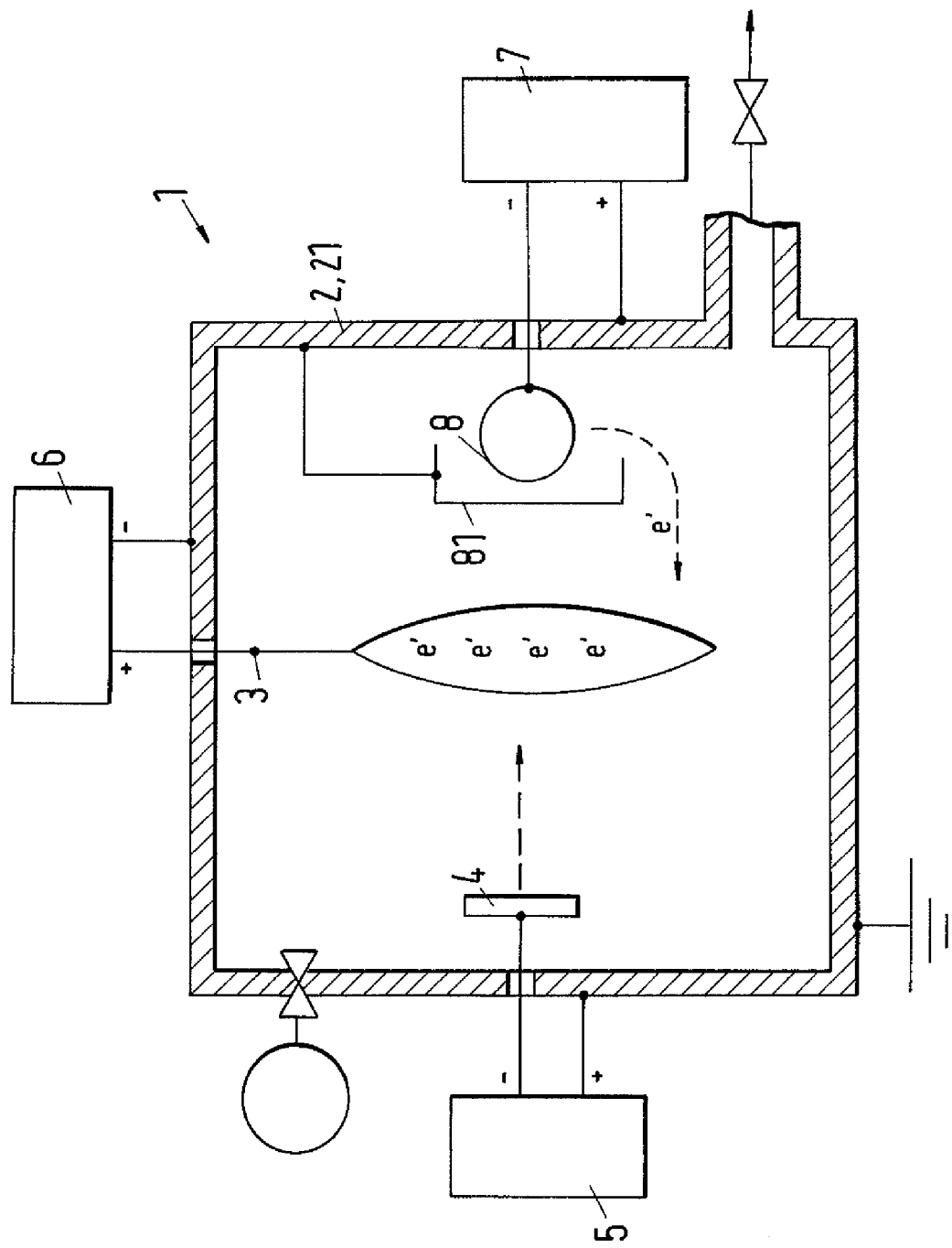

PHYSICAL VAPOUR DEPOSITION COATING DEVICE AS WELL AS A PHYSICAL VAPOUR DEPOSITION METHOD

CROSS-REFERENCE TO RELATED APPLICATIONS

The present application claims priority under 35 U.S.C. § 119 of European Patent Application No. 08162884.4 filed on Aug. 25, 2008, the disclosure of which is expressly incorporated by reference herein in its entirety.

The invention relates to a physical vapour deposition coating device as well as to a physical vapour deposition method in accordance with the preamble of the independent claim of the respective category.

Generally, known PVD coating devices, for example such as magnetron sputtering devices or arc evaporation devices are used to provide all kinds of tools and components with coatings in order to give the surface a functional and possibly also decorative configuration. In the case of tools, these are predominantly coatings using metal-containing components, for example TiN, TiAlN, TiAlSiN, TiCN, CN, t-aC, WC:H, DLC coatings in general. One known technique for the production of coatings is the deposition of condensates from the gas phase. Numerous devices are used for this, each of which is optimized for particular methods. Devices in which the coating is made up of a high proportion of ionized atoms from a plasma are particularly advantageous for forming the coating.

In coating devices with which a high proportion of metal ions is produced in the plasma, a metallic material is regularly evaporated from the target cathode, and a given proportion of the evaporated material is ionized. Regarding for example arc evaporation devices, the target cathode material is firstly melted before it enters the gas phase. However, in known devices of this type, in which the target cathode material passes through a molten phase, the disadvantage is found that, during the evaporation of alloys in the gas phase, droplets are formed and the gas phase is not homogeneous. Accordingly, the condensed coatings contain so-called droplets and/or the composition of the coating is rendered inhomogeneous.

Other known coating devices are configured in such a way that, in order to evaporate the target cathode material, cathodic sputtering takes place, for example with a magnetron field being used to increase the ionization efficiency. In this case, the material is converted directly from the solid state into the vapour state, without bringing it in the molten state in between.

However, cathodic sputtering devices have the disadvantage that the evaporated material is only weakly ionized. The plasma consists predominantly of evaporated neutral particles (degree of ionization about 5%) and other ionized gas particles which originate from working cases for ejecting target atoms and ions and for producing the plasma, or from reactive gases which bond with the target cathode materials. In the case of rough technical surfaces, in particular ket abraded or ground ones, the coatings deposited from these plasmas have disadvantages in terms of their properties of adhesion, hardness, structure and surface topography (smoothness and colour). In the case of such substrate surfaces, it has to date not been possible to produce a so-called dimpled surface coating which is distinguished by a dense, compact structure with smooth surface.

WO 91/00374 discloses a process and a device for coating substrates, in which both arc discharge volatilization and cathodic evaporation are used, the arc discharge volatilization being carried out before the cathodic evaporation. The circuitry according to the WO 91/00374 includes a voltage source connected between a cathode and a chamber wall, a voltage source connected between the cathode and an anode and a voltage source for supplying a substrate with a bias voltage. An almost identical device is disclosed in the EP 0 558 061 A1.

The EP 0 677 595 A1 discloses a device for an arc discharge volatilization only. The device includes a single voltage supply, in which the cathode is connected continuously to the voltage supply, while optionally the anode or the substrate are connected to the remaining pole of the voltage supply.

An essential drawback of the devices known from the state of the art is that for many applications the degree of ionization is not sufficient, resulting in particular in insufficient dense coatings or the coating process as such has a poor efficiency, respectively, leading to an inadmissible duration of the coating process which in turn results in high costs.

It is thus an object of the invention to provide an improved coating device as well as an improved coating method which renders possible a sufficient high degree of ionization, in particular for producing coatings such as TiN, TiAlN, TiAlSiN, TiCN, CN, WC:H, DLC coatings in general, especially for producing ta-C coatings, so that improved, very high dense coatings can be produced using the newly proposed coating device and the coating process, respectively, so that a high coating efficiency is achieved, leading to a considerably reduced duration of the coating process which in turn will result in lower costs.

The subject matter of the invention which satisfies these objects is characterized by the features of the independent claims of the respective category.

The subordinate claims relate to particularly advantageous embodiments of the invention.

The invention relates to a physical vapour deposition coating device, comprising a process chamber with an anode and a consumable cathode to be consumed by an electrical discharge for coating a substrate located within the process chamber. The coating device further includes a first electrical energy source being connected with its negative pole to said consumable cathode, and a second electrical energy source being connected with its positive pole to said anode. According to the invention, a third electrical energy source is provided being connected with its negative pole to a source cathode which is different from the consumable cathode.

Switching on the third electrical energy source, that is the source cathode in accordance with the present invention while coating the substrate, for example during magnetron sputtering or arc evaporation, leads to an extra ionization of the plasma species, especially of the working gas. The use of the source cathode while coating gives also a better plasma confinement, preferably at the middle of the process chamber, as the negatively charged source cathode pushes back the electrons to the centre of the process chamber space. The new technique according to the invention will open possibilities for deposition with high flux ion bombardment of the substrate and is in particular aimed at making possible deposition of a variety of carbon coatings, in particular ta-C coatings, which are known as DLC (Diamond Like Carbon) coatings with superior wear resistance being also favourable concerning the anti-adhesive behaviour.

Operating with magnetron sputtering, switching on the source cathode during the coating process results in improved ionization of the chamber gas. As a result higher energetic bombardment is achieved on the substrate leading to better and denser films. The current to the substrate table may increase by more than 100%

Operating with high power pulsed magnetron sputtering (HPPMS), HPPMS gives a very high ionization of the target material. The source cathode is used to ionize the working gas. As a result a very high ionization of both gas and metal is achieved. The current to the table can increase by at least 50% and up to 100%

Operating with arc evaporators will give a very high ionization of the target material. The source cathode is used to ionize the working gas. As a result a very high ionization of both gas and metal is achieved. The current to the table can be increased by at least 30% up to 200%

The much increased ion fraction in the plasma allows for a high flux low energy ion bombardment which is known to enhance the coating density without inducing too many defects in the coating.

In particular, but not only all of the following coatings could benefit from the extra energy bombardment provided by the AEGD: TiN, TiAlN, TiAlSiN, TiCN, CN, t-aC, WC:H, DLC coatings in general. Especially C-based coating can be made much better as the SP3 bonds in the coating can increase dramatically as a result of the increased ion bombardment.

TiN and C coatings were deposited using HPPMS and the source cathode and also TiN was deposited using dc and the source cathode showing very dense coatings.

Regarding a special embodiment of the present invention, a chamber wall of the process chamber defines a ground potential and or/the positive pole of the first electrical energy source is connected to the chamber wall and/or the negative pole of the second energy source is connected to the chamber wall and/or the positive pole of the third electrical energy source is connected to the chamber wall.

Preferably but not necessarily, the source cathode is shielded by an electron shield and/or the electron shield is connected to the positive pole of the third electrical energy source and/or to the chamber wall. Using the electron shield renders possible the adjustment of the amount of additional electrons provided by the source cathode, for example by adjusting the potential of the electron shield accordingly. The electron shield can also help to shape the size and the shape of the electron confinement at the middle of the process chamber.

In a special embodiment, the consumable cathode is a sputtering cathode and in another embodiment the consumable cathode is an arc cathode.

In this connection, It is understood that in one and the same process chamber more than one sputtering cathode and/or more than one arc cathode can be provided and, of course, it is also possible that in one and the same process chamber more that one source cathode can be advantageously used. In particular, the arc cathode and the sputtering cathode may be provided at the same time in one and the same process chamber.

The anode can be a separate anode, in particular an ignition anode for setting up and/or maintaining an arc between the consumable cathode and the anode and/the anode can be the chamber wall as in principle known from the state of the art.

Regarding another embodiment of the present invention a forth electrical energy source can be provided to be connected to the substrate while coating as in principle known from the state of the art in order to set the substrate to defined potential.

Furthermore, the invention relates to a method for coating a substrate within a process chamber comprising an anode and a consumable cathode being consumed by an electrical discharge while coating the substrate. A first electrical energy source is provided and connected with its negative pole to said consumable cathode, and a second electrical energy source is connected with its positive pole to said anode. According to the invention, a third electrical energy source is provided which can be connected with its negative pole to a source cathode and which is different from the consumable cathode, wherein the third electrical energy source is switched on while coating the substrate.

Preferably, a chamber wall of the process chamber defines a ground potential and or/the positive pole of the first electrical energy source is connected to the chamber wall and/or the negative pole of the second energy source is connected to the chamber wall and/or the positive pole of the third electrical energy source is connected to the chamber wall.

In a special embodiment, the source cathode is shielded by an electron shield while coating and/or the electron shield is connected to the positive pole of the third electrical energy source and/or to the chamber wall leading to the advantages as discussed above.

Regarding a preferred embodiment of the present invention, the physical vapour deposition method is an arc process, in particular a high-power pulsed arc coating method, and/or the physical vapour deposition method is a sputtering process, in particular a magnetron sputtering process, preferably a high-power pulsed magnetron sputtering process.

Since high-power pulsed magnetron sputtering processes are very important in practice, in the following, some essential well known principles and properties of the so called "High-Power Impulse Magnetron Sputtering" (HIPIMS) or "High-Power Pulsed Magnetron Sputtering" (HPPMS) will be summarized in brief.

A typical well known pulse sequence for High-Power Magnetron Sputtering consists of equally spaced high-power pulses, each single pulse having a duration of for example 100 µs. The time interval between two pulses may be about 10 ms.

Increasing the applied electrical power by using well spaced short pulses leads to a denser plasma without overheating the target wherein at the same time the erosion of the target, that is the exploitation of the target is improved. Using in addition the source cathode according to the present invention, the dense of the plasma is further increases so that the sputtered coatings will show excellent feature as already described above.

Of course, there are a variety of different embodiments of High-Power Magnetron Sputtering methods known in the state of the art using high-power pulses which all can advantageously be combined with the method according to the present invention or can be used in a physical vapour deposition coating device in accordance with the present invention.

For example, uni-polar methods are well known in the state of the art in which two subsequent high-power pulses have the same polarity, that is for example, the target is always the negative electrical pole and the wall of the process chamber is always the positive electrical pole of the high-power pulses.

On the other hand, also bi-polar methods are well known which are characterized in that two subsequent high-power pulses have different polarity. That is, regarding a first high-power pulse, the target is for example the negative electrical pole wherein for a subsequent second high-power pulse the target is the positive pole of the sputtering system.

A so called "Superimposed Mode" is also well known. The superimposed mode is a special embodiment of a uni-polar pulse sequence wherein in addition to the uni-polar sequence a DC-Voltage of a given value is superimposed.

High-power pulse sequences can also be very advantageously applied in reactive sputtering methods as well as in non-reactive sputtering methods in a manner as well known by the person skilled in the art.

The method of choice to be used may depend on a variety of boundary conditions and requirements to be fulfilled, and may for example depend on the substrate, the type of elements required for the coating, the required properties of the films to be coated and so on.

A new improved High-Power Magnetron Sputtering process which can be particularly advantageously combined with the present invention is described in applicants European Patent Application EP 08161322.6.

As in principle known form the state of the art, a forth electrical energy source is provided and connected to the substrate while coating in order to set the substrate to defined potential.

What is very important in practice, a coating comprising TiN, TiAlN, TiAlSiN, TiCN, CN, t-aC, WC:H, or a DLC coating in general is deposited onto the substrate using a method in accordance with the present invention.

In the following, the invention will be explained in more detail with reference to the drawings. Shown are:

FIG. 1: a preferred embodiment of a process chamber according to the present invention.

A physical vapour deposition chamber is formed in the interior of the process chamber 2 having chamber walls 21 made of e.g. stainless steel plate, the walls of the housing thus being electrically conducting and may act as the anode 3. Regarding the special embodiment of FIG. 1, a separate anode 3 is additionally provided which is for example an ignition anode 3 for setting up and/or maintaining an arc between the consumable cathode 4 and the anode 3.

The housing 21 has for example the shape of a circular cylinder. The target 4, which is the consumable cathode 4, is located in parallel to the flat end walls 21 of the process chamber 2. The target 4 is preferably a rectangular or a circular plate of material, which is to be applied to a substrate in order to establish a coating in form of a film. Due to clarity reasons, the substrate is not shown in FIG. 1. The person skilled in the art knows how and where in the process chamber the substrate can be advantageously placed.

At the rear end of the target 4, at a surface which is not directed towards the center of the process chamber 2, a magnet assembly (not shown) can be mounted so that the north pole or poles are arranged at the periphery of the target and the south pole or poles at the center of the target 4. Thus, the magnetic field lines of the magnets will pass from the periphery of a support of the target to the center thereof. Preferably, the magnetic field is most intense at the poles of magnets. It is understood that also other known configurations can also be advantageously used.

According to the invention, a third electrical energy source 7 is provided being connected with its negative pole to the source cathode 8 which is different from the consumable cathode 4, that is which source cathode 8 is different from the target 4 and is shielded by the electron shield 81.

It is understood that the invention is not only related to the special embodiments discussed above but, of course, further embodiments are included, too. In particular, the invention relates to all advantageous combinations of the discussed embodiments.

The invention claimed is:

1. A physical vapour deposition coating device, comprising:
    a process chamber;
    an anode;
    a consumable cathode facing a center of the process chamber when viewed from a position above the process chamber and being arranged on one side of the center of the process chamber, said consumable cathode being configured to be consumed by an electrical discharge for coating a substrate located within the process chamber;
    said consumable cathode and said anode being structured and arranged to one of:
        produce and/or maintain an arc between the anode and the consumable cathode; and/or
        ionize target material of the consumable cathode to generate a plasma;
    a source cathode that is different from the consumable cathode;
    said source cathode being arranged on an opposite side of the center of the process chamber when viewed from the position above the process chamber;
    an electron shield shielding the source electrode;
    a first electrical energy source comprising negative and positive poles;
    the negative pole of the first electrical energy source being connected to the consumable cathode;
    a second electrical energy source separate from the first electrical energy source and comprising negative and positive poles;
    the positive pole of the second electrical energy source being connected to the anode;
    a third electrical energy source separate from the first and second electrical energy sources and comprising negative and positive poles;
    the third electrical energy source being structured and arranged to switch on during coating of the substrate;
    the negative pole of the third electrical energy source being connected to the source cathode; and
    the positive pole of the third electrical energy source being connected to the electron shield,
    wherein the source cathode is structured and arranged to confine the plasma by pushing back electrons toward a center of the process chamber.

2. The device of claim 1, wherein the process chamber comprises a wall that defines a ground potential.

3. The device of claim 1, wherein the process chamber comprises a wall and the positive pole of the first electrical energy source is connected to the wall.

4. The device of claim 1, wherein the process chamber comprises a wall and the positive pole of the third electrical energy source is connected to the wall.

5. The device of claim 1, wherein the consumable cathode is a sputtering cathode.

6. The device of claim 1, wherein the consumable cathode is an arc cathode.

7. The device of claim 1, wherein the anode is structured and arranged to maintain an arc between the consumable cathode and a wall of the process chamber functioning as an anode.

8. The device of claim 1, wherein the anode is an ignition anode and is spaced from a wall of the process chamber and is configured to produce and/or maintain an arc between the consumable cathode and the ignition anode.

9. The device of claim 1, further comprising a fourth electrical energy source adapted to be connected to the substrate.

10. A method of coating a substrate using the device of claim 1, wherein the method comprises:
   arranging a substrate in the process chamber; and
   coating the substrate.

11. The method of claim 10, wherein the physical vapour deposition utilizes one of:
   an arc process; and
   high-power pulsed arc coating.

12. The method of claim 10, wherein the physical vapour deposition utilizes one of:
   sputtering; and
   magnetron sputtering.

13. The method of claim 10, wherein the physical vapour deposition utilizes high-power pulsed magnetron sputtering process.

14. The method of claim 10, further comprising connecting a fourth electrical energy source to the substrate.

15. The method of claim 10, wherein the coating comprises one of: TiN, TiAlN, TiAlSiN, TiCN, CN, t-aC, WC:H, or a DLC coating.

16. The method of claim 10, further comprising connecting the electron shield to a wall of the process chamber.

17. A physical vapour deposition coating device utilizing high power pulsed magnetron sputtering (HPPMS), comprising:
   a process chamber;
   an ignition anode;
   a consumable cathode configured to be consumed by an electrical discharge for coating a substrate located within the process chamber;
   said consumable cathode and said ignition anode being structured and arranged to ionize target material of the consumable cathode to generate a plasma;
   a source cathode that is different from the consumable cathode;
   said source cathode and said consumable cathode being disposed on opposite sides of a center of the process chamber when viewed from a location above the process chamber;
   an electron shield shielding the source electrode;
   a first electrical energy source comprising negative and positive poles;
   the negative pole of the first electrical energy source being connected to the consumable cathode;
   a second electrical energy source that is different from the first electrical energy source and comprising negative and positive poles;
   the positive pole of the second electrical energy source being connected to the ignition anode;
   a third electrical energy source comprising negative and positive poles and being capable of being switched on during coating of the substrate;
   the negative pole of the third electrical energy source being connected to the source cathode; and
   the positive pole of the third electrical energy source being connected to the electron shield,
   wherein the source cathode is structured and arranged to ionize a working gas in the process chamber pushes back electrons toward a center of the process chamber during plasma confinement.

18. The device of claim 17, wherein the ignition anode is spaced from a wall of the process chamber and is configured to produce and/or maintain an arc between the consumable cathode and the ignition anode.

19. A physical vapour deposition coating device, comprising:
   a cylindrical process chamber housing wall;
   an ignition anode;
   a consumable cathode configured to be consumed by an electrical discharge for coating a substrate located within the process chamber;
   said consumable cathode and said ignition anode being structured and arranged to one of:
      produce and/or maintain an arc between the ignition anode and the consumable cathode; or
      ionize target material of the consumable cathode to generate a plasma;
   a source cathode that is different from the consumable cathode and being each of:
      structured and arranged to ionize a working gas; and
      utilized for plasma confinement;
   said source cathode and said consumable cathode being disposed on opposite sides of a center of the process chamber housing wall when viewed from a location above the process chamber housing wall;
   an electron shield shielding the source electrode;
   a first electrical energy source comprising negative and positive poles;
   the negative pole of the first electrical energy source being connected to the consumable cathode;
   the positive pole of the first electrical energy source being connected to said wail;
   a second electrical energy source comprising negative and positive poles;
   the positive pole of the second electrical energy source being connected to the ignition anode;
   the negative pole of the second electrical energy source being connected to said wall;
   a third electrical energy source comprising negative and positive poles and being capable of being switched on during coating of the substrate;
   the negative pole of the third electrical energy source being connected to the source cathode;
   the positive pole of the third electrical energy source being connected to the electron shield and to said wall; and
   the ignition anode is spaced from said wall and is configured to produce and/or maintain an arc between the consumable cathode and the ignition anode,
   wherein the source cathode is structured and arranged to push back electrons toward a center of the process chamber during the plasma confinement.

20. The device of claim 19, wherein the device utilizes high power pulsed magnetron sputtering (HPPMS) and the process chamber comprises a wall that defines a ground potential.

21. A physical vapour deposition coating device, comprising:
   a process chamber arranged inside a process chamber wall;
   a consumable cathode configured to be consumed by an electrical discharge for coating a substrate located within the process chamber;
   a target material of the consumable cathode being ionized to generate a plasma;
   a source cathode that is different from the consumable cathode;
   said source cathode being utilized to ionize a working gas in the process chamber;

said source cathode and said consumable cathode being disposed on opposite sides if a center of the process chamber when viewed from a location above the process chamber housing wall;

an electron shield shielding the source electrode and being connected to the wall;

a first electrical energy source comprising negative and positive poles;

the negative pole of the first electrical energy source being connected to the consumable cathode;

the positive pole of the first electrical energy source being connected to the wall;

a second electrical energy source comprising negative and positive poles;

the positive pole of the second electrical energy source being connected to an ignition anode;

the negative pole of the second electrical energy source being connected to the wall;

a third electrical energy source separate from the first electrical energy source and comprising negative and positive poles;

the negative pole of the third electrical energy source being connected to the source cathode; and the positive pole of the third electrical energy source being connected to the wall, wherein the source cathode is structured and arranged to push back electrons toward a center of the process chamber so as to confine the plasma and ionize a working gas in the process chamber.

22. The device of claim 21, wherein the device utilizes high power pulsed magnetron sputtering (HPPMS).

23. The device of claim 21, wherein the device utilizes high power pulsed arc coating.

24. The device of claim 21, wherein the consumable cathode is one of a sputtering cathode and an arc cathode.

25. A physical vapour deposition coating device, comprising:

a process chamber;

an anode;

a consumable cathode configured to be consumed by an electrical discharge for coating a substrate located within the process chamber;

a source cathode that is different from the consumable cathode;

an electron shield shielding the source electrode;

a first electrical energy source comprising negative and positive poles;

the negative pole of the first electrical energy source being connected to the consumable cathode;

a second electrical energy source separate from the first electrical energy source and comprising negative and positive poles;

the positive pole of the second electrical energy source being connected to the anode;

a third electrical energy source separate from the first and second electrical energy sources and comprising negative and positive poles;

the negative pole of the third electrical energy source being connected to the source cathode;

the positive pole of the third electrical energy source being connected to the electron shield; and a fourth electrical energy source adapted to be connected to the substrate during coating of the substrate.

* * * * *